(12) United States Patent
Trezza (10) Patent No.: US 7,871,927 B2
(45) Date of Patent: Jan. 18, 2011

(54) WAFER VIA FORMATION

(75) Inventor: John Trezza, Nashua, NH (US)

(73) Assignee: Cufer Asset Ltd. L.L.C., Wilmington, DE (US)

( * ) Notice: Subject to any disclaimer, the term of this patent is extended or adjusted under 35 U.S.C. 154(b) by 0 days.

(21) Appl. No.: 11/872,083

(22) Filed: Oct. 15, 2007

(65) Prior Publication Data

US 2008/0090413 A1     Apr. 17, 2008

Related U.S. Application Data

(60) Provisional application No. 60/829,772, filed on Oct. 17, 2006.

(51) Int. Cl.
*H01L 21/445* (2006.01)

(52) U.S. Cl. ................ 438/667; 438/668; 257/E21.597

(58) Field of Classification Search ................ 257/734, 257/E21.597; 438/667, 598–601, 605, 618, 438/620, 666, 668, 672, 673, 674, 675, 677, 438/700, 702, 735
See application file for complete search history.

(56) References Cited

U.S. PATENT DOCUMENTS

| | | |
|---|---|---|
| 3,312,878 A | 4/1967 | Poch et al. |
| 5,037,782 A | 8/1991 | Nakamura et al. |
| 5,075,253 A | 12/1991 | Sliwa, Jr. |
| 5,100,480 A | 3/1992 | Hayafuju |
| 5,220,530 A | 6/1993 | Itoh |
| 5,229,315 A | 7/1993 | Jun et al. |
| 5,308,784 A | 5/1994 | Kim et al. |
| 5,399,898 A | 3/1995 | Rostoker |
| 5,563,084 A | 10/1996 | Ramm et al. |
| 5,587,119 A | 12/1996 | White |
| 5,608,264 A | 3/1997 | Gaul |
| 5,614,743 A * | 3/1997 | Mochizuki .................. 257/276 |
| 5,708,569 A | 1/1998 | Howard et al. |
| 5,780,776 A | 7/1998 | Noda |
| 5,814,889 A | 9/1998 | Gaul |
| 5,872,338 A | 2/1999 | Lan et al. |
| 5,929,524 A | 7/1999 | Drynan et al. |

(Continued)

FOREIGN PATENT DOCUMENTS

EP      0 516 866 A1     12/1992

(Continued)

OTHER PUBLICATIONS

Topol, A.W. et al., "Enabling Technologies for Wafer-Level Bonding of 3D MEMS and Integrated Circuit Structures", Electronic Components and Technology Conference, 2004, vol. 1, Jun. 1-4, 2004, pp. 931-938.

(Continued)

*Primary Examiner*—Matthew C Landau
*Assistant Examiner*—Aaron Staniszewski (57) ABSTRACT

A method of electrically conductive via formation in a fully processed wafer involves defining at least one trench area on a backside of the fully processed wafer, forming at least one trench within the trench area to an overall depth that will allow for a via formed within the trench to be seeded over its full length, forming the via within the trench into the fully processed wafer to a predetermined depth, depositing a seed layer over the full length of the via, and plating the seed layer to fill the via with an electrically conductive metal.

19 Claims, 6 Drawing Sheets

U.S. PATENT DOCUMENTS

| | | | |
|---|---|---|---|
| 5,962,922 A | 10/1999 | Wang | |
| 5,973,396 A | 10/1999 | Farnworth | |
| 6,013,551 A | 1/2000 | Chen et al. | |
| 6,037,665 A | 3/2000 | Miyazaki | |
| 6,075,710 A | 6/2000 | Lau | |
| 6,184,066 B1 | 2/2001 | Chino et al. | |
| 6,215,114 B1 | 4/2001 | Yagi et al. | |
| 6,314,013 B1 | 11/2001 | Ahn et al. | |
| 6,316,737 B1 | 11/2001 | Evans et al. | |
| 6,330,145 B1 * | 12/2001 | Lepert et al. | 361/220 |
| 6,391,770 B2 * | 5/2002 | Kosaki et al. | 438/650 |
| 6,498,089 B2 | 12/2002 | Komada | |
| 6,498,387 B1 * | 12/2002 | Yang | 257/620 |
| 6,559,540 B2 | 5/2003 | Kawashima | |
| 6,577,013 B1 | 6/2003 | Glenn et al. | |
| 6,590,278 B1 | 7/2003 | Behun et al. | |
| 6,599,778 B2 | 7/2003 | Pogge et al. | |
| 6,706,554 B2 | 3/2004 | Ogura | |
| 6,740,576 B1 | 5/2004 | Lin et al. | |
| 6,770,822 B2 | 8/2004 | Pasternak et al. | |
| 6,790,775 B2 * | 9/2004 | Fartash | 438/667 |
| 6,887,792 B2 | 5/2005 | Perlov et al. | |
| 6,939,789 B2 | 9/2005 | Huang et al. | |
| 7,157,310 B2 | 1/2007 | Benson et al. | |
| 2001/0001292 A1 | 5/2001 | Bertin et al. | |
| 2001/0033509 A1 | 10/2001 | Ahn et al. | |
| 2001/0048166 A1 | 12/2001 | Miyazaki | |
| 2002/0017399 A1 | 2/2002 | Chang et al. | |
| 2002/0027441 A1 | 3/2002 | Akram et al. | |
| 2002/0053726 A1 | 5/2002 | Mikubo et al. | |
| 2002/0094675 A1 | 7/2002 | Kerr et al. | |
| 2002/0102835 A1 | 8/2002 | Stucchi et al. | |
| 2002/0127761 A1 | 9/2002 | Mottura et al. | |
| 2002/0134581 A1 | 9/2002 | Figueroa et al. | |
| 2003/0032278 A1 * | 2/2003 | Chen et al. | 438/627 |
| 2003/0047799 A1 | 3/2003 | Cheever et al. | |
| 2003/0052324 A1 | 3/2003 | Kimura | |
| 2003/0071272 A1 | 4/2003 | Faska et al. | |
| 2003/0080408 A1 | 5/2003 | Farnworth et al. | |
| 2003/0085471 A1 | 5/2003 | Iijima et al. | |
| 2003/0159262 A1 | 8/2003 | Pasternak et al. | |
| 2003/0183943 A1 | 10/2003 | Swan et al. | |
| 2003/0206680 A1 | 11/2003 | Bakir et al. | |
| 2003/0232488 A1 * | 12/2003 | Chua et al. | 438/460 |
| 2004/0016942 A1 | 1/2004 | Miyazawa et al. | |
| 2004/0051168 A1 | 3/2004 | Arai et al. | |
| 2004/0124523 A1 | 7/2004 | Poo et al. | |
| 2004/0207061 A1 | 10/2004 | Farrar et al. | |
| 2004/0219763 A1 * | 11/2004 | Kim et al. | 438/455 |
| 2004/0256686 A1 | 12/2004 | Sassolini et al. | |
| 2004/0262635 A1 | 12/2004 | Lee | |
| 2005/0046034 A1 | 3/2005 | Farrar | |
| 2005/0104027 A1 | 5/2005 | Lazarev | |
| 2005/0104219 A1 | 5/2005 | Matsui | |
| 2005/0121768 A1 | 6/2005 | Edelstein et al. | |
| 2005/0146049 A1 | 7/2005 | Kripesh et al. | |
| 2005/0164490 A1 * | 7/2005 | Morrow et al. | 438/629 |
| 2006/0003578 A1 * | 1/2006 | Lee et al. | 438/638 |
| 2006/0042952 A1 * | 3/2006 | Oliver et al. | 205/122 |
| 2006/0046471 A1 | 3/2006 | Kirby et al. | |
| 2006/0234443 A1 * | 10/2006 | Yang et al. | 438/253 |
| 2006/0292854 A1 * | 12/2006 | Wang | 438/622 |
| 2008/0006938 A1 * | 1/2008 | Patti et al. | 257/734 |
| 2008/0020488 A1 * | 1/2008 | Clevenger et al. | 438/3 |

FOREIGN PATENT DOCUMENTS

| | | |
|---|---|---|
| EP | 0 757 386 A2 | 2/1997 |
| EP | 1 415 950 | 5/2004 |

OTHER PUBLICATIONS

International Search Report, PCT/US06/23364, dated Nov. 13, 2006.
International Search Report, PCT/US06/23366, dated Dec. 8, 2006.
International Search Report, PCT/US06/23297, dated Jan. 3, 2007.
International Search Report, PCT/US06/23249, dated Jun. 11, 2007.
International Search Report, PCT/US06/23361, dated Sep. 19, 2007.
International Search Report and Written Opinion for PCT/US2007/81380 mailed on Mar. 17, 2008.
International Preliminary Report on Patentability for PCT/US2007/081380 issued Apr. 22, 2009.
Extended European Search Report issued in European Patent Application No. 07844296.9 and dated Jun. 30, 2010.
First Office Action issued in Chinese Patent Application No. 2007800375496 and issued Aug. 10, 2010.

* cited by examiner

WAFER VIA FORMATION

CROSS REFERENCE TO RELATED APPLICATIONS

This application claims the benefit of priority, under 35 USC 119(e)(1), of U.S. Provisional Patent Application Ser. No. 60/829,772, the entirety of which is incorporated herein by reference.

BACKGROUND

When working with semiconductor wafers, it is desirable to handle thick wafers to ensure they do not break during processing. However, the deeper the via, the harder it is to get a seed layer into it using currently available deposition techniques and equipment, particularly if cost is a consideration. Typically, applying a seed layer to a depth of more than 150 um in a narrow via is generally difficult and cost-ineffective. Thus, it is difficult to use the vias of the aforementioned patent applications on a wafer while maintaining the typically about 500 to 750 um (or thicker) thickness that is common to most commercially available wafers, without first thinning them, if a plating approach to filling the narrow width vias will be used. However, thinning such wafers to the appropriate thickness can render the wafers flexible but, because they are brittle, significantly likely to break during handling. While this may be an acceptable risk for a pre-processed wafer, where the cost is minimal, it is not acceptable for a fully processed wafer (i.e. one that already has undergone at least its front end processing, and in many cases its backend processing as well) because the cost is significantly higher.

SUMMARY OF THE INVENTION

We have devised a way to overcome the above problem in a manner that allows the above-referenced vias to be used on fully processed wafers without having to thin the wafer down to fragile thicknesses. Moreover, our approach does not require the use of extremely high precision or high cost techniques to do so.

In our approach, the thickness of only select portions of the wafer will be reduced. In this manner, within the reduced areas, the thickness is such that the above-referenced via approaches can be used and an appropriate seed layer can be deposited. Moreover, because the only portions of the area are reduced, the overall structural rigidity of the wafer can be retained to the extent necessary to allow for the necessary handling. Still further, regions where the thickness is to be reduced can be limited to areas where vias are to be located and can be etched in large fashion using coarse etching techniques if desired because the boundaries are not critical. In fact, in some cases, post via-formation thinning will remove the boundaries entirely.

One implementation of the approach for electrically conductive via formation in a fully processed wafer involves defining at least one trench area on a backside of the fully processed wafer, forming at least one trench within the trench area to an overall depth that will allow for a via formed within the trench to be seeded over its full length, forming the via within the trench into the fully processed wafer to a predetermined depth, depositing a seed layer over the full length of the via, and plating the seed layer to fill the via with an electrically conductive metal.

The advantages and features described herein are a few of the many advantages and features available from representative embodiments and are presented only to assist in understanding the invention. It should be understood that they are not to be considered limitations on the invention or limitations on equivalents. For instance, some of these advantages are mutually contradictory, in that they cannot be simultaneously present in a single embodiment. Similarly, some advantages are applicable to one aspect of the invention, and inapplicable to others. Additional features and advantages will become apparent in the following description and the drawings.

DETAILED DESCRIPTION

U.S. patent applications Ser. Nos. 11/329,481, 11/329,506, 11/329,539, 11/329,540, 11/329,556, 11/329,557, 11/329,558, 11/329,574, 11/329,575, 11/329,576, 11/329,873, 11/329,874, 11/329,875, 11/329,883, 11/329,885, 11/329,886, 11/329,887, 11/329,952, 11/329,953, 11/329,955, 11/330,011 and 11/422,551, describe various techniques for forming small, deep vias in semiconductor wafers. The contents of those applications is incorporated herein by reference as if fully set forth herein.

Our techniques described in those applications allow for via densities and placement that was previously unachievable and can be performed on a chip, die or wafer scale. In some cases, it is desirable to perform the techniques on a wafer that already has had its devices formed, and its backend processing (i.e. formation of inter-device, interconnect metalization layers) completed, or on a wafer that has not been pre-thinned. Typical semiconductor wafers are typically about 500 um to 750 um or greater in thickness.

However, as noted above, with wafers of that thickness, it is extremely difficult to create numerous, small densely packed vias that can extend down to device contacts or one or more of the backend metalization layers and can be seeded so that they can be metalized. The approaches described in the above-referenced patent applications generally avoid the issue by pre-thinning the wafer before via formation, if a wafer scale approach is to be used. However, as noted above, thinning the full wafer beyond a certain amount causes it to become too fragile to be handled using routine wafer processing approaches.

Our approach is a "trench" technique that involves first etching regions of the backside of the fully formed wafer to allow the wafer to be thin in those regions where it needs to be for deep via formation while allowing proper seed deposition, while a large portion of the wafer is maintained either at full thickness or some pre-thinned thickness that still maintains the wafer at a thickness and overall rigidity that will allow it to be further handled in a routine manner.

Depending upon the particular implementation, the thinned regions can:

i) cover an area equal to or exceeding the area of an individual chip as it will exist once diced;

ii) cover smaller areas where groups of vias will be formed; or iii) cover only those individual areas where individual vias will be formed.

For purposes of consistency, such a reduced area will be referred to herein as a "trench" with the understanding that the term is not intended to incorporate any particular shape, aspect (i.e. depth to width) relationship or other geometric configuration.

Moreover, these trenches can be created so that they can assist in some later-performed step as will be described in greater detail below.

Irrespective of the which of the above three approaches are used, the total area of the trenches relative as a fraction of the overall area of the wafer should typically be under 75% and typically 50% or less to ensure the structural integrity of the wafer and ability for it to be handled in a conventional manner is maintained.

Advantageously, trench formation can be done with the same etch processes used for forming the vias. Alternatively, the trench(es) can be formed using a lower-precision process like a wet-etch process.

Still further, the trench depth can be greater or lesser depending upon the via diameter and depth. Notably, the trench depth needed is one that will allow for a via that is formed into the wafer within the trench to be seeded to its complete depth. For example, a wafer with an overall thickness of 750 um, would only require a trench that would render the wafer 400 um thick in the required area if 50 um diameter vias were to be created. or a trench to render the wafer 150 um thick if 10 um diameter vias were to be made. As noted above, deeper trenches (i.e. thinner wafer regions) can also be accommodated, although the thinner the wafer within the trench, the greater the remaining area of wafer that must be left.

In some cases, typically those with the narrowest diameter vias, a multi-stepped approach can be used in which two or more "stacked trenches" are used to bring the wafer down to the necessary reduced thickness while maintaining the overall structural integrity.

Finally, while the approach is illustratively described with respect to vias such as described in the above referenced, commonly assigned, patent applications, the same approach can be used with other via formation techniques that have similar issues.

Turning now to the figures, FIGS. 1A through 1G illustrate, in simplified form, one example approach of the "trench" technique.

Figure 1A:
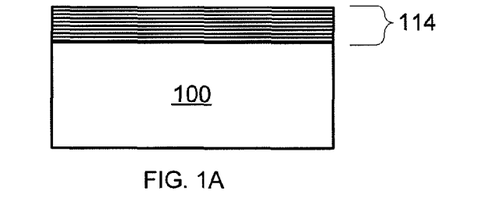
FIGS. 1A through 1H illustrate, in simplified form, one example approach of the "trench" technique.

FIG. 1A illustrates, in simplified form, a part of a semiconductor wafer 100. As shown, the semiconductor is full thickness and ready for dicing, in that both front end and backend processing are complete. However, for purposes of this example, we presume that the wafer will also be processed to add vias from the back side down to some portion of one of the layers of metalization placed as part of the backend processing.

The process proceeds as follows.

Figure 1B:
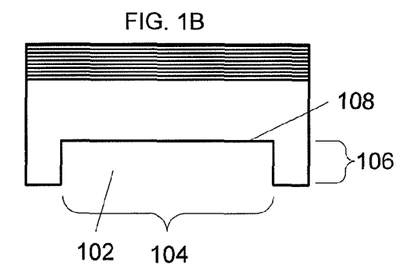

First, as shown in FIG. 1B, a trench 102 is formed over the area where the deep metal filled vias will be, but the wafer is too thick to allow for either via etching down to the depth required, seed deposition or both. The trench area 104 is defined and formed using, for example, a conventional dry etch or wet etch approach down to a depth 106 sufficient to define a new outer surface 108, of sufficient distance from (in this example) the metalization point 114 that will be connected to, and to meet the criteria necessary for via creation and seed deposition down to that metalization point 114.

Note that the surface shape of the trench 102 is limited only by the ability to define it. Thus, depending upon the particular application, any shape from a simple quadrilateral or circular shape to a highly complex geometric shape can be used.

Next, the via is formed in the desired manner. As shown in FIG. 1C through FIG. 1G, for purposes of illustration, an annular via approach such as described in the above-referenced patent applications is used.

Figure 1C:
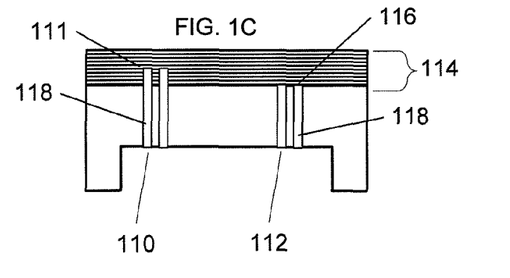

For purposes of illustration and simplicity, two vias 110, 112 within the trench 102 are shown. For purposes of understanding, the via 110 on the left will extend to an intermediate point 110 in the metalization layers, whereas the via 112 on the right will only extend to the first metalization layer 116. However, it should be understood that, because the vias 110, 112 are of different depths, they would not be formed at the same time, but rather, vias of a common depth would be created at the same time if they had the same diameter. In addition, it should be understood that the annular vias 110, 112 are not in any way shown to scale and, in fact all proportions are grossly exaggerated and out of scale.

Figure 1D:
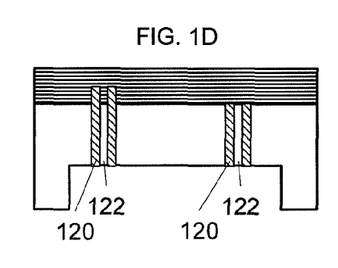
Figure 1E:
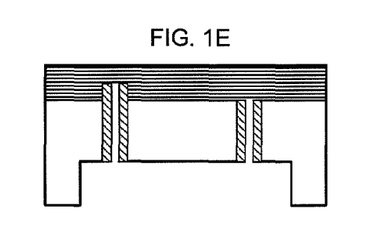
Figure 1F:
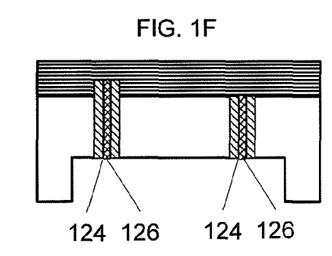

Returning to the Figures, as shown in FIG. 1C, an annular ring shaped via trench 118 is formed. As shown in FIG. 1D, the via trench 118 is filled with an insulator 120. As shown in FIG. 1E, the inner island of semiconductor material 122 within the insulator 120 is removed. As shown in FIG. 1F, a seed layer 124 is deposited and the via filled with metal 126 using, in this example, an electroplating process. Thereafter, any additional desired processing steps, such as formation of device pads or other acts not relevant to understanding the process, are performed.

Figure 1G:
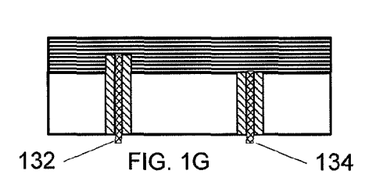
Figure 1H:
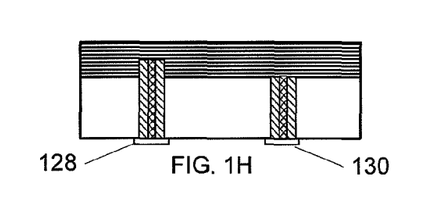

Finally, as shown in FIGS. 1G and 1H, depending upon the extent of the trench used (i.e. if it was a single trench exceeding the boundaries of the chip or not) the wafer will either simply be sawn or diced (for the former case) or it can now be thinned to provide access to the contacts 128, 130 formed by the metal-filled vias and then diced or sawn. In either case, depending upon the thinning approach, in some implementation variants, the newly formed vias can be used as posts 132, 134, in other implementation variants, the vias can have contact pads 128, 130 attached to them.

Note that, although the approach was illustrated for a pair of vias, the approach would be the same for a single via or for multiple vias (from two to literally hundreds or more), the only difference being the size or shape of the trench that would be used.

Figure 2:
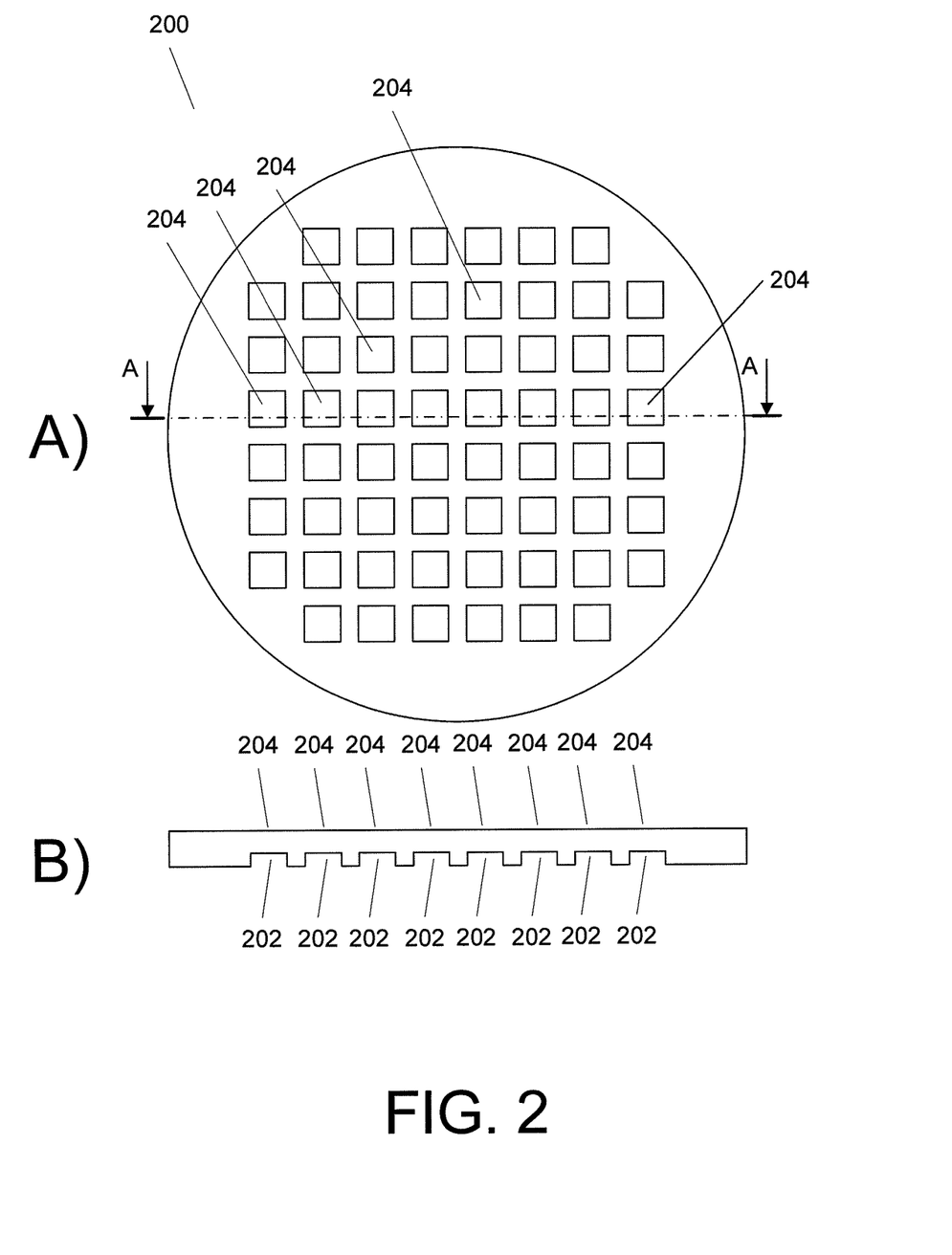
FIG. 2 illustrates, in simplified form, a wafer using one example approach as described herein.

FIG. 2 illustrates, in simplified form, a wafer 200 using one example approach as described herein, both from the trench side (FIG. 2A) and, in cross section taken at A-A (FIG. 2B). With this approach, the trenches 202 are sized and shaped so as to be aligned with, and slightly larger than, the individual chips 204 formed on the wafer 200.

FIGS. 3A through 3L illustrate a variant of the aforementioned approach involving two or more "stacked" trenches to accommodate, for example, extremely narrow vias in a thick wafer or specific contact formation requirements.

Figure 3A:
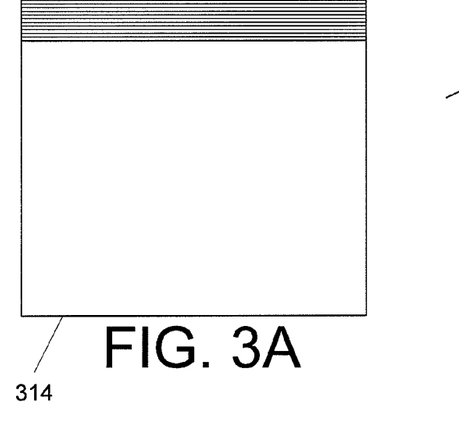
FIGS. 3A through 3L illustrate a variant of the aforementioned approach involving two or more "stacked" trenches.

As with the above approach, this approach begins with a fully formed wafer 300, a simplified portion of which is shown in FIG. 3A.

Figure 3B:
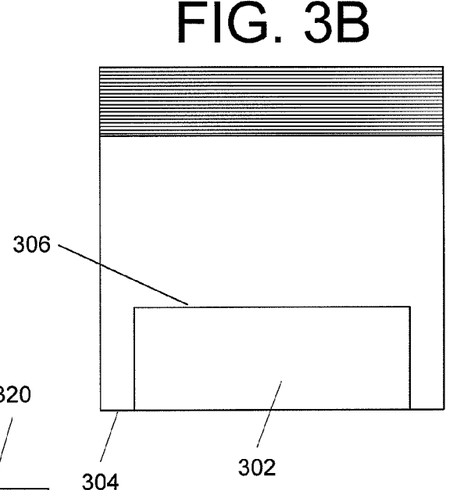

As shown in FIG. 3B, a trench 302 is formed in the back side 304 of the wafer 300 down to a specified depth 306, again using, for example, a wet or dry etch approach.

Figure 3C:
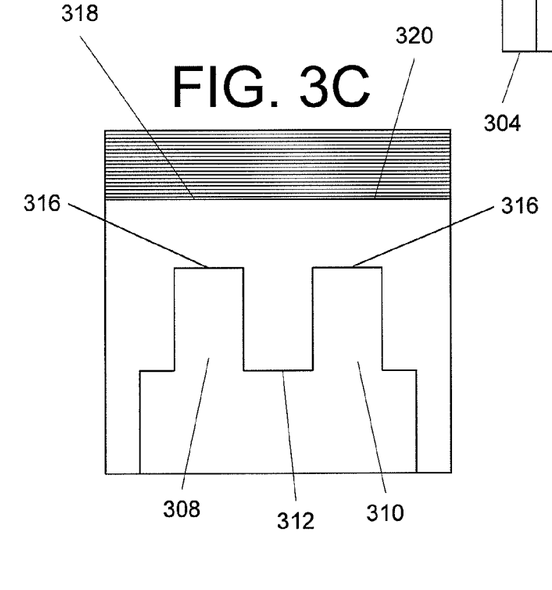

Next, as shown in FIG. 3C, a pair of smaller trenches 308, 310 are formed in the bottom surface 312 of the first trench 302 in the same way as the first trench 302 was formed. To avoid confusion, note that the "same way" merely means that the lower surface 312 of the first trench 302 is treated as a starting surface (i.e. like the original surface 314 of the wafer 300 before the first trench 302 was formed). It is not intended to imply that the identical approach used to form the first trench must be used—the same or a different approach could be used.

After formation of the secondary depth trenches 308, 310, the distance between the bottom surface 316 of the secondary trenches 308, 310 and the desired connection points 318, 320 will be within the necessary range to allow for seed deposit with the intended via sizing.

Figure 3D:
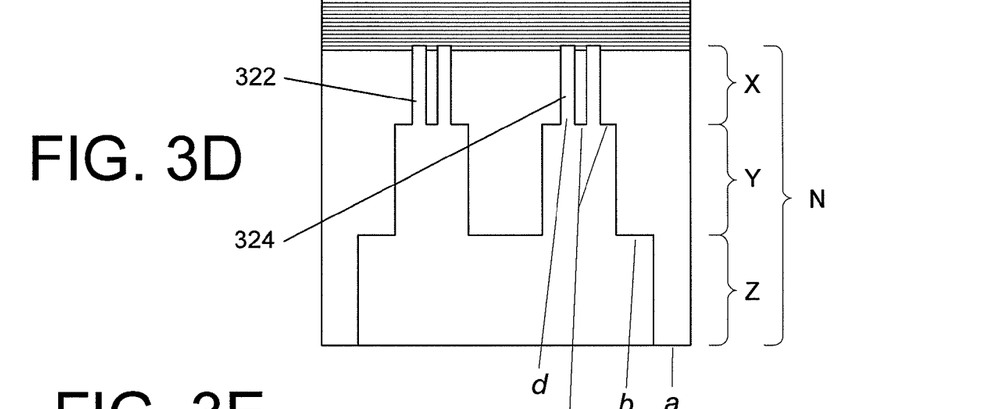

Now, the actual via formation process can begin and, for purposes of example and simplicity, the basic annular via approach is used (bearing in mind that, as above, dimensions are not to scale). Thus, as shown in FIG. 3D, an annular via 322, 324 is created that extends from the bottom 316 of the secondary trench 308, 310 to the respective desired connection points 318, 320, here again, a respective point in the metalization layers.

At this point it should be noted that, even though two different trenches 302, 308 were used to establish the appropriate depth, on a wafer basis, the thickness of a significant portion of the wafer remains at the original surface 314 to connection point 318 thickness N. Moreover, an even greater portion of the wafer 300 remains at a thickness of N–Z and only a small portion of the wafer is at a thickness of N–(Y+Z). Still further, using this multi-depth (or multiple stepped) approach, a flexibility in selecting the depths Y and Z is available without significant risk of weakening the wafer.

Figure 3E:
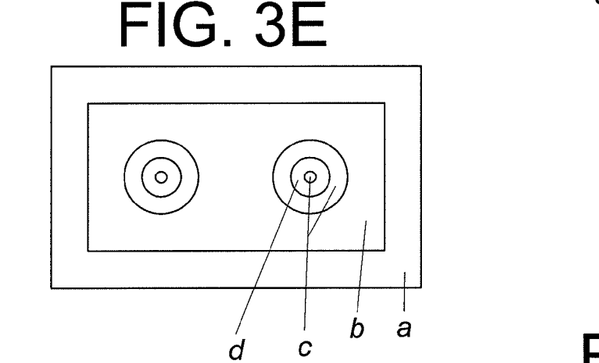

FIG. 3E illustrates a view of the portion of the wafer 300 taken from the trench side. FIG. 3E, therefore, provides an alternate view of surfaces "a","b", and "c" and the annular trench "d".

Figure 3F:
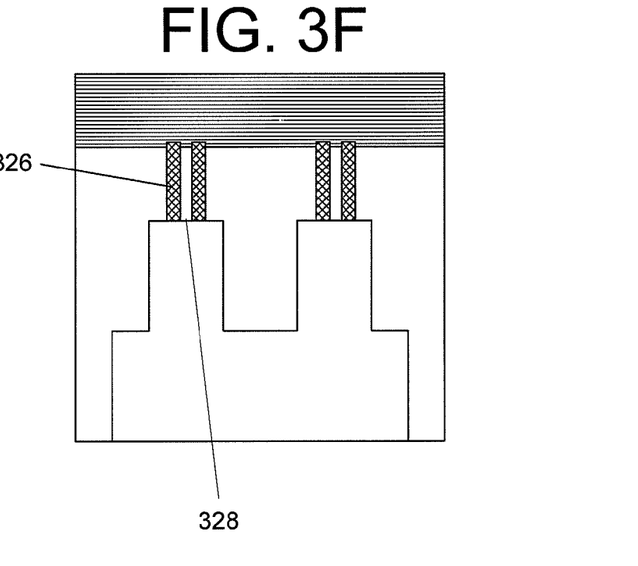
Figures 3G, 3H, 3I, 3K:
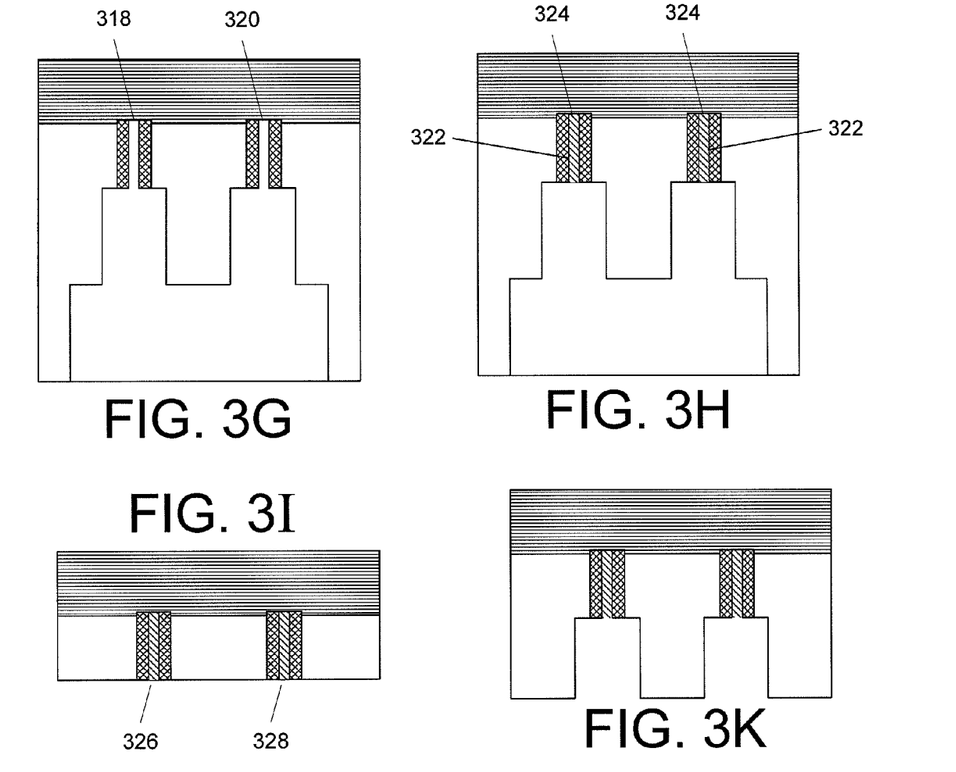

FIG. 3F shows the wafer 300 after the annular vias 322, 324 have been filled with an insulator 326. FIG. 3G shows the wafer 300 after the island 328 of semiconductor material within the annular insulator 326 has been removed down to the desired metalization connection point 318, 320. FIG. 3H shows the wafer 300 after the void has been seeded 322 and filled with metal 324.

Figure 3J:
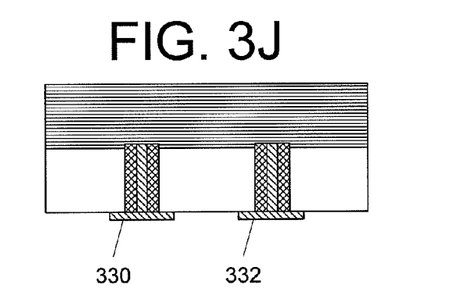
Figure 3L:
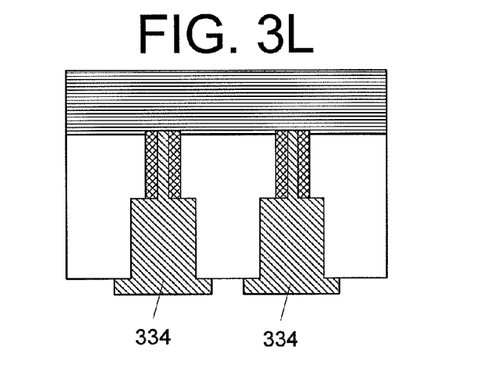

At this point, with this approach, two new options become available. With one option, as shown in FIG. 3I, the wafer 300 can be diced and the chips, can be thinned to expose the newly formed contacts 326, 328, or the wafer 300 can be thinned before dicing—in either case followed by, for example, creation of contact pads 330, 332 if desired or necessary (FIG. 3J). With the other option, if, for example, the reason for the need for very narrow vias was related to the point to be connected to as opposed to the overall via pitch and the secondary trenches were appropriately sized and spaced, the wafer or chip (if diced) could be thinned down simply to the secondary vias (FIG. 3K). Thereafter, the secondary vias could themselves be filled with a conductor 334, such as shown in FIG. 3L, before, or as part of, a contact pad formation process. In this manner, greater wafer or chip thickness can be maintained.

Figure 4:
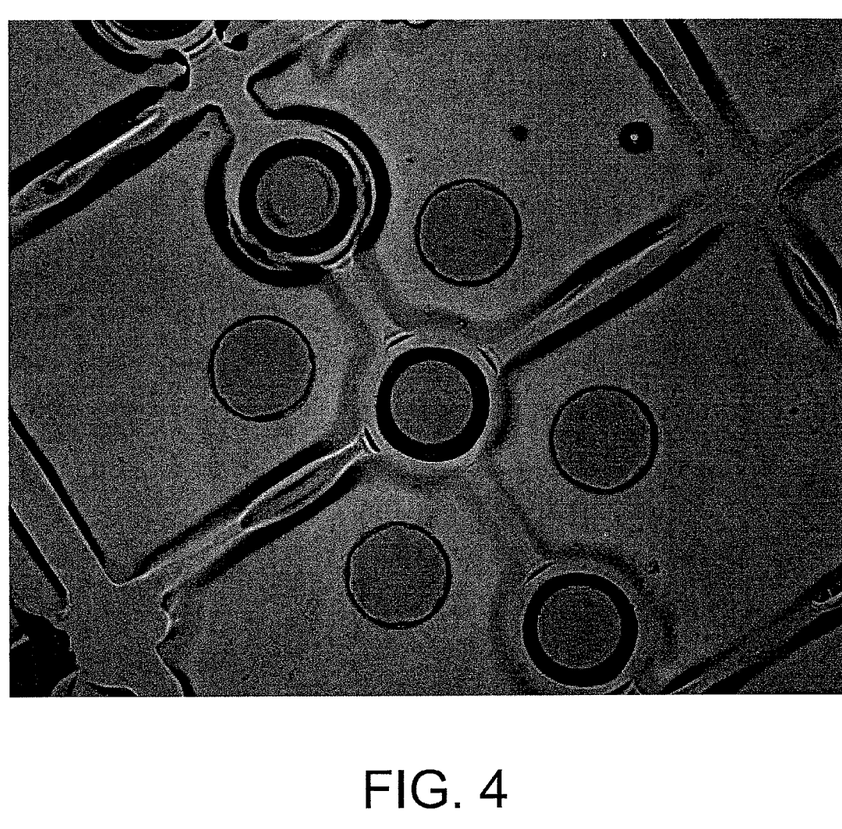
FIG. 4 is a photograph of a portion of a wafer created using one of the approaches described herein.

FIG. 4 is a photograph of a portion of a wafer created using one of the above approaches. As can be seen, in the approach of FIG. 4, multiple trenches are used within the boundaries of a single chip, in this case on an individual via basis.

Finally, it is worth noting that, in some variants, the trenches can be formed so as to serve other purposes as well. For example, in various implementations, the trenches can be designed to help channel insulator into an annular trench or to confine metal that will become or otherwise form a rerouting trace. Thus, depending upon the particular implementation and configuration, the trenches can advantageously serve multiple purposes beyond merely addressing the via depth problem noted above.

It should thus be understood that this description (including the figures) is only representative of some illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A method of forming an electrically-conductive via in a processed wafer, the method comprising:
    forming a first trench into a backside of the processed wafer;
    forming a second trench having a cross-sectional area into an end surface of the first trench;
    forming a via extending from an end surface of the second trench into the backside of the processed wafer to a first predetermined depth, wherein the via has a cross-sectional area that is smaller than the cross-sectional area of the second trench;
    depositing a seed layer over a full length of the via between the first predetermined depth and the end surface of the second trench;
    plating the seed layer to fill the via with an electrically-conductive material;
    thinning the backside of the processed wafer at least after said forming a second trench; and
    depositing a conductor within the second trench after said thinning the backside of the processed wafer.

2. The method of claim 1, wherein at least one of said forming a first trench or said forming a second trench comprises etching the backside of the processed wafer using at least one of a wet etch or a dry etch process.

3. The method of claim 1, further comprising forming a plurality of trenches into the backside of the processed wafer, wherein the plurality of trenches define a trench area, and wherein the trench area is less than 75 percent of an overall area of the backside of the processed wafer.

4. The method of claim 3, wherein the trench area is less than 50 percent of the overall area of the backside of the processed wafer.

5. The method of claim 1, wherein the processed wafer comprises multiple chips, the method further comprising defining a periphery for a trench area that exceeds an outer boundary of one or more of the multiple chips.

6. The method of claim 1, wherein said thinning the backside of the processed wafer provides access to the electrically-conductive material in the via.

7. The method of claim 6, further comprising sawing or dicing a chip from the fully processed wafer following said thinning.

8. The method of claim 1, wherein the processed wafer comprises multiple chips, the method further comprising defining a periphery for a trench area that is at least partially within an outer boundary of one of the multiple chips.

9. The method of claim 1, wherein the processed wafer comprises multiple chips, the method further comprising defining a trench area that is substantially aligned with one of the multiple chips, wherein the trench area has a size slightly larger than the one of the multiple chips.

10. The method of claim 1, further comprising sawing or dicing a chip from the processed wafer.

11. The method of claim 1, wherein the first trench has a peripheral boundary defining a first trench area, and wherein the second trench is formed within the first trench area.

12. The method of claim 11, wherein said forming a via comprises forming the via within a peripheral boundary of the second trench.

13. A method of forming an electrically-conductive via in a processed wafer, the method comprising:
- forming a first trench from a backside of the processed wafer, wherein the first trench is formed partially into the processed wafer, and wherein the backside of the processed wafer has not been thinned;
- forming a second trench from an end surface of the first trench to a first predetermined depth, wherein the second trench has a cross-sectional area;
- forming a via from an end surface of the second trench into the backside of the processed wafer to a second predetermined depth, wherein the via has a cross-sectional area that is smaller than the cross-sectional area of the second trench;
- depositing a seed layer over a full length of the via between the second predetermined depth and the end surface of the second trench;
- plating the seed layer to fill the via with an electrically-conductive metal;
- thinning the backside of the processed wafer at least alter said forming a second trench; and
- depositing a conductor within the second trench after said thinning the backside of the processed wafer.

14. The method of claim 13, wherein the first trench has a first periphery and the second trench has a second periphery, and wherein the second trench is formed within the first periphery.

15. The method of claim 14, wherein the first and second peripheries and the second predetermined depth are selected to allow the via to be deposited with the seed layer over the full length and to be filled with the electrically-conductive material.

16. The method of claim 1, wherein the conductor substantially fills the second trench.

17. The method of claim 13, wherein the conductor substantially fills the second trench.

18. The method of claim 1, wherein said depositing a conductor within the second trench comprises depositing the conductor within the second trench as part of a contact pad formation process.

19. The method of claim 13, wherein said depositing a conductor within the second trench comprises depositing the conductor within the second trench as part of a contact pad formation process.

* * * * *

UNITED STATES PATENT AND TRADEMARK OFFICE
CERTIFICATE OF CORRECTION

PATENT NO. : 7,871,927 B2
APPLICATION NO. : 11/872083
DATED : January 18, 2011
INVENTOR(S) : Trezza Page 1 of 1

It is certified that error appears in the above-identified patent and that said Letters Patent is hereby corrected as shown below:

Title page, item (57), under "Abstract", in Column 2, Line 1, delete "electrically conductive" and insert -- electrically-conductive --.

Title page, item (57), under "Abstract", in Column 2, Line 9, delete "electrically conductive" and insert -- electrically-conductive --.

Column 8, line 1, in Claim 13, delete "alter" and insert -- after --.

Signed and Sealed this
Twenty-sixth Day of June, 2012

David J. Kappos
*Director of the United States Patent and Trademark Office*